US010007195B2

(12) United States Patent
Horn et al.

(10) Patent No.: US 10,007,195 B2
(45) Date of Patent: Jun. 26, 2018

(54) DEVICE FOR DETERMINING A TILT ANGLE OF AT LEAST ONE MIRROR OF A LITHOGRAPHY SYSTEM, AND METHOD

(71) Applicant: Carl Zeiss SMT GmbH, Oberkochen (DE)

(72) Inventors: Jan Horn, Munich (DE); Markus Holz, Aalen (DE); Joerg Specht, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days. days.

(21) Appl. No.: 15/145,114

(22) Filed: May 3, 2016

(65) Prior Publication Data
US 2016/0246186 A1    Aug. 25, 2016

Related U.S. Application Data

(63) Continuation of application No. PCT/EP2014/072022, filed on Oct. 14, 2014.

(30) Foreign Application Priority Data

Nov. 11, 2013    (DE) .................. 10 2013 222 935

(51) Int. Cl.
*G03F 7/20*    (2006.01)
*G02B 26/08*   (2006.01)

(52) U.S. Cl.
CPC ...... *G03F 7/70616* (2013.01); *G03F 7/70075* (2013.01); *G03F 7/7085* (2013.01); *G03F 7/70116* (2013.01); *G02B 26/0833* (2013.01)

(58) Field of Classification Search
None
See application file for complete search history.

(56) References Cited

U.S. PATENT DOCUMENTS

2004/0109074 A1*  6/2004  Jung ............... H04N 5/335
                                                 348/308
2009/0002668 A1   1/2009  Rohe et al.
(Continued)

FOREIGN PATENT DOCUMENTS

DE   10 2009 009 372 A1   8/2010
EP       2 009 501 A2    12/2008
(Continued)

OTHER PUBLICATIONS

Machine trastion of description of WO 2010/094658.*
(Continued)

*Primary Examiner* — Steven H Whitesell Gordon
(74) *Attorney, Agent, or Firm* — Fish & Richardson P.C.

(57) ABSTRACT

An apparatus for establishing a tilt angle of at least one mirror of a lithography installation is disclosed. The apparatus includes a pattern generating device (6) for generating a pattern. The apparatus also includes an image acquisition device for acquiring the generated pattern which was reflected by the mirror. The apparatus further includes a comparator device for providing a comparison result in a manner dependent on a comparison of the acquired pattern with a reference pattern. In addition, the apparatus includes an evaluation device for establishing the tilt angle in a manner dependent on the comparison result. The image acquisition device and the comparator device are provided in the same integrated circuit.

20 Claims, 7 Drawing Sheets

(56) References Cited

U.S. PATENT DOCUMENTS

2010/0067095 A1 3/2010 Fulton et al.
2015/0300807 A1 10/2015 Xalter et al.

FOREIGN PATENT DOCUMENTS

| WO | WO 2004/063695 A1 | 7/2004 |
| WO | WO 2008/075095 A1 | 6/2008 |
| WO | WO 2008/095695 A1 | 8/2008 |
| WO | WO 2010/094658 A1 | 8/2010 |

OTHER PUBLICATIONS

Moore, Gordon E. "Cramming More Components onto Integrated Circuits", Proceedings of the IEEE, vol. 86, No. 1, Jan. 1998, pp. 82-85.*

Translation of International Search Report for corresponding PCT Appl No. PCT/EP2014/072022, dated Feb. 9, 2015.

\* cited by examiner

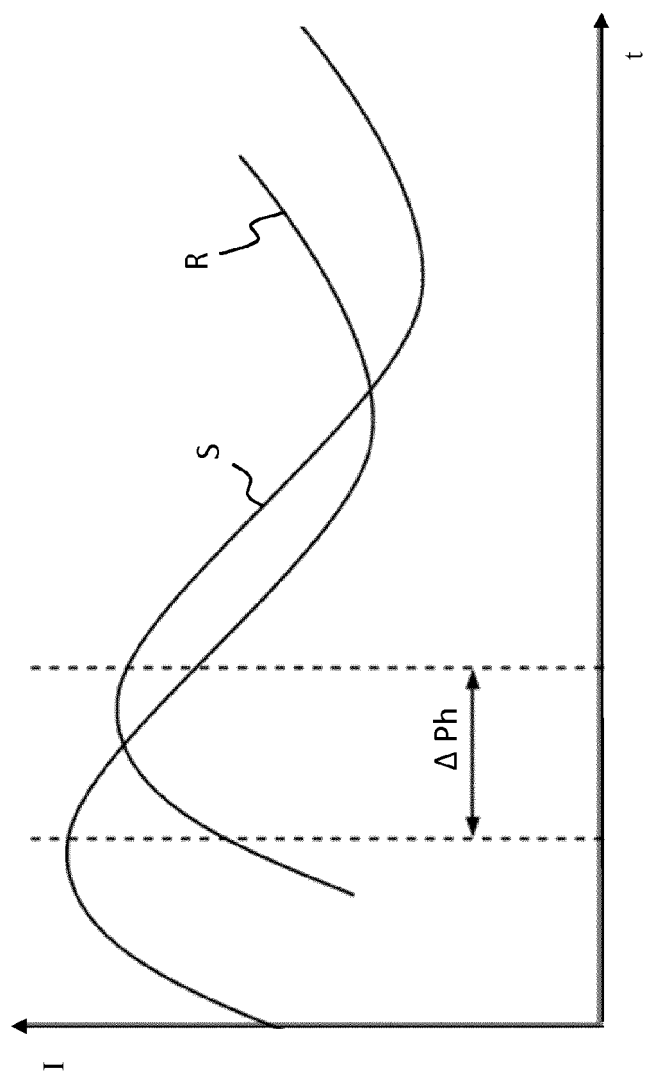

DEVICE FOR DETERMINING A TILT ANGLE OF AT LEAST ONE MIRROR OF A LITHOGRAPHY SYSTEM, AND METHOD

CROSS-REFERENCE TO RELATED APPLICATIONS

The present application is a continuation of, and claims benefit under 35 USC 120 to, international application PCT/EP2014/072022, filed Oct. 14, 2014, which claims benefit under 35 USC 119 of German Application No. 10 2013 222 935.6, filed Nov. 11, 2013. The entire disclosure of international application PCT/EP2014/072022 and German Application No. 10 2013 222 935.6 are incorporated by reference herein.

FIELD

The disclosure relates to an apparatus for establishing a tilt angle of at least one mirror of a lithography installation and to a method.

BACKGROUND

By way of example, lithography installations are used in the production of integrated circuits or ICs for imaging a mask pattern in a mask onto a substrate such as e.g. a silicon wafer. In so doing, a light beam generated by an optical system is directed through the mask onto the substrate.

Currently, EUV lithography installations which use light with a wavelength in the range from 5 nm to 30 nm, in particular 13.5 nm, are in development. "EUV" denotes "extreme ultraviolet". In the case of such lithography installations, because of the high absorption of light of this wavelength by most materials, reflective optics, that is to say mirrors, have to be used instead of—as previously—refractive optics, that is to say lenses. The provision of mirrors in the form of so-called mirror fields (also referred to as mirror arrays), which may include several hundred thousand mirrors, is known. Here, the mirrors are each tiltable about one axis or two mutually perpendicularly oriented axes in order to guide the light on a suitable path to the substrate to be exposed. For the purposes of tilting the mirrors, actuators which are actuated by way of a control loop are assigned to the former. An apparatus for monitoring the tilt angle of a respective mirror is provided as part of the control loop.

By way of example, WO 2010/094658 A1 has disclosed such an apparatus for monitoring at least one mirror. The apparatus includes an acquisition device and a pattern source. A pattern provided by the pattern source is mirrored by the mirror onto the acquisition device. The tilt angle of the mirror is determined in a manner dependent on the light acquired by the acquisition device.

The mirrors of a mirror field in particular regularly have a resonant frequency of several hundred hertz, and so a quick measurement of the tilt angle is desirable. As a result of this, faster regulation of the tilt angle could be made possible, as a result of which, ultimately, the quality of the mask pattern imaged on the substrate can be improved. Moreover, the throughput of the lithography installation can be increased.

SUMMARY

Accordingly, the present disclosure seeks to provide an apparatus and a method for establishing a tilt angle of at least one mirror of a lithography installation, which enable a fast establishment of the tilt angle of the mirror.

In one aspect, the disclosure provides an apparatus for establishing a tilt angle of at least one mirror of a lithography installation. The apparatus includes a pattern generating device for generating a pattern, an image acquisition device for acquiring the generated pattern which was reflected by the mirror, a comparator device for providing a comparison result in a manner dependent on a comparison of the acquired pattern with a reference pattern, and an evaluation device for establishing the tilt angle in a manner dependent on the comparison result. The image acquisition device and the comparator device are provided in the same integrated circuit.

As a result of the image acquisition device and the comparator device being provided in the same integrated circuit, it is possible to establish the tilt angle of the at least one mirror very quickly. The spatial pooling of the image acquisition device and comparator device in particular allows faster signal processing.

As a result of establishing the tilt angle quickly, it is possible, in particular, to scan the tilt angle with a frequency sufficiently far above the resonant frequency of the corresponding mirror, for example with up to five times the resonant frequency. As a result of this, an aliasing-free measurement is rendered possible. Moreover, the measurement is less sensitive to background light since use can be made of patterns which vary quickly in time.

More advantageously, this scanning can be carried out in an external control loop. That is to say, a local control loop, for example in an ASIC (application-specific integrated circuit) which is provided in the direct vicinity of the assigned mirror, can be dispensed with. Establishing the tilt angle at a distance from a respective mirror (external control loop) is furthermore advantageous in that the setup of a respective mirror or an actuation of same simplifies. This is advantageous, particularly in view of the replacement of components for servicing purposes in the case of a fault. Moreover, a digital regulation of the tilt angle of a respective mirror can be realized by way of the external control loop, simplifying a reaction to faults. The voltage supply of the actuation of a respective mirror also becomes simpler, leading to cost advantages.

In the present case, a "pattern" should be understood to mean one or more light points which radiate light. The light radiated by the light points can change over time—in particular periodically—in terms of the intensity thereof. Here, the intensity of the radiated light can vary between zero, i.e. no light, and a maximum value. In the present case, "light" should be understood to mean any electromagnetic radiation. Additionally or alternatively, the light points are able to move in space. By way of example, the pattern generating device can have a printed carrier, such as e.g. paper or canvas. Furthermore, the pattern generating device can have a screen, such as e.g. a TFT screen, on which the pattern is depicted. Moreover, the pattern generating device can include a multiplicity of separate illuminants in a suitable arrangement. The illuminants can be embodied for example in the form of light-emitting diodes, in particular in the form of a light-emitting diode field (LED array). The at least one mirror can be configured to reflect onto the image acquisition device only a pattern portion of the pattern generated by the pattern generating device. This embodiment is included by the "image acquisition device for acquiring the generated pattern which was reflected" in the present case.

The image acquisition device includes at least one photosensitive element which converts an optical signal (light which is part of the pattern) into an electrical signal. The at least one photosensitive element is a constituent of the integrated circuit. By way of example, provision can be made of a camera having a multiplicity of the integrated circuits, wherein a respective integrated circuit is configured to monitor one mirror in each case.

The evaluation device is configured to output a signal which contains or represents information about the tilt angle.

In the present case, an "integrated circuit" should be understood to mean an electronic circuit (also referred to as monolithic circuitry) arranged on a single semiconductor substrate (wafer).

The apparatus can have a multiplicity of mirrors, which each reflect a pattern onto a respectively assigned image acquisition device. A respective comparator device provides a respective comparison result in a manner dependent on a comparison of the acquired pattern with a reference pattern. A respectively assigned evaluation device establishes a tilt angle of a respective mirror in a manner dependent on the comparison result. A respective image acquisition device and a respective comparator device are provided in a respective integrated circuit. The multiplicity of integrated circuits can be provided in a camera.

Instead of the mirror field, the apparatus can also acquire a tilt angle of a portion of a mirror in the form of a free-form surface. Such free-form surfaces are subdivided into regions, which are each deformable by way of actuators in order thus to guide the light on a suitable path to the exposed substrate. In this case, the "tilt angle" should be understood to the extent that an orientation of a portion of such a free-form surface is also included.

The comparison of the acquired pattern with the reference pattern includes the comparison of a first electric signal with a second electric signal. These can each be available in analog or digital form.

The acquired pattern can be only a portion of the generated pattern in terms of time and/or space, which pattern was reflected by the mirror. By way of example, provision can be made for the mirror or the image acquisition device only "to see" part of the pattern generating source or of the screen, and hence of the generated pattern, in terms of space. However, if the pattern runs across the pattern generating device or the screen, the mirror or the image acquisition device "sees" the whole generated pattern over time.

The apparatus can be configured to establish a respective tilt angle of at least one mirror about two different axes.

In accordance with a further embodiment, the pattern generating device is configured to generate a time-varying pattern. Thus, the tilt angle can be easily established by a comparison with the reference pattern.

In accordance with a further embodiment, the comparator device is configured to provide the comparison result in a manner dependent on a comparison of a phase of the pattern with a phase of the reference pattern. Such a phase comparison renders it possible to establish the tilt angle reliably and quickly. Here, "phase" should not be understood as restricted to a sinusoidal signal. The pattern and the reference pattern can have any other periodic signal, for example in the form of a rectangular pulse or a periodic, randomized signal. In the present case, the "phase comparison" should also include establishing any other time offset.

In accordance with a further embodiment, the comparator device has a correlator, a phase loop and/or a phase-measuring circuit.

In accordance with a further embodiment, the pattern generating device is configured to generate two patterns which are time varying in mutually perpendicular directions or one pattern which is time varying in mutually perpendicular directions. This renders it possible to establish a tilt angle of the at least one mirror about two mutually perpendicular axes. In the present case, mutually perpendicular directions should be understood to mean an angle between 90±45°, preferably 90±20° and more preferably between 90±5°.

In accordance with a further embodiment, the pattern generating device has a first and a second pattern source, wherein the first pattern source is configured to generate the pattern which is time varying in one direction and the second pattern source is configured to generate the pattern which is time varying in the direction perpendicular thereto. The two pattern sources are arranged in a manner spatially separated from one another. Accordingly, the first pattern source then serves to establish a first tilt angle of the at least one mirror about a first axis and the second pattern source then serves to establish a second tilt angle of the at least one mirror about a second axis perpendicular to the first axis. By using two pattern sources that are independent of one another, an actuation of same for generating the respective patterns can be simplified.

In accordance with a further embodiment, the pattern generating device has a single pattern source which is configured to generate the pattern which is time varying in two mutually perpendicular directions. By way of example, the only pattern source can be configured to generate a pattern which moves in a meandering fashion in a plane. Here, a respective position of the pattern is assigned to exactly one first tilt angle of the at least one mirror about the first axis and exactly one second tilt angle of the at least one mirror about the second axis. Furthermore, the only pattern source can be configured to generate two patterns e.g. with different frequencies, which patterns superpose in the mutually perpendicular directions. The use of a single pattern source can have a simpler setup in relation to the embodiment with two pattern sources.

In accordance with a further embodiment, a first image acquisition device and a first comparator device are provided on a first integrated circuit. Furthermore, a second image acquisition device and a second comparator device are provided on a second integrated circuit. The first image acquisition device acquires the one pattern and the second image acquisition device acquires the other pattern. The first comparator device compares the one pattern with a first reference pattern and the second comparator device compares the other pattern with a second reference pattern. Any number of further image acquisition devices and comparator devices, for example several hundred thousand, may be provided. These can be integrated into a camera. By way of example, the first and second and any number of further integrated circuits may be provided integrated into a single semiconductor substrate or into a plurality of semiconductor substrates.

In accordance with a further embodiment, the first integrated circuit is provided in a first camera and the second integrated circuit is provided in a second camera. By way of example, the first camera can be configured to monitor the tilt angle of one or more mirrors about the first axis and the second camera can be configured to monitor a tilt angle of the one or more mirrors about the second axis.

The use of two different cameras for monitoring a tilt angle about the first axis and the second axis can promote a fast tilt angle establishment.

In accordance with a further embodiment, the image acquisition device acquires the patterns in alternation. The comparator device compares the patterns with a respective reference pattern in alternation. By way of example, no second camera is required as a result thereof, and so a more cost-effective setup emerges.

In accordance with a further embodiment, the pattern generating device, in particular the first and second pattern source in each case or the only pattern source, depicts a pattern with exactly one period. As a result, the acquisition of a single pattern portion by the image acquisition device can suffice for determining the tilt angle of the at least one mirror. Hence, a simple and quick establishment of the tilt angle can be achieved. Preferably, the period corresponds precisely to the width or height of the pattern source or the screen.

In accordance with a further embodiment, the pattern source is configured to generate a chirp signal. Very generally, the chirp signal includes a signal whose frequency changes over time. Specifically, the chirp signal can contain a signal with a fundamental frequency and optionally at least one signal with a frequency that is an integer multiple of the frequency of the fundamental frequency.

In accordance with a further embodiment, the pattern generating device is configured to generate a pattern constant in time. This constitutes an alternative to using the time-varying pattern, but it can also be used in addition to the latter. The pattern generating device, in particular a single pattern source such as a screen, can be configured to depict a pattern constant in time with exactly one period.

In accordance with a further embodiment, the comparator device is configured to provide the comparison result in a manner dependent on a comparison of an intensity and/or a wavelength of the acquired pattern with an intensity and/or wavelength of the reference pattern.

In accordance with a further embodiment, the comparator device has a device for color channel analysis.

In accordance with a further embodiment, the intergrated circuit has a photosensitive element which is configured to acquire the generated pattern continuously. "Continuously" should be understood to mean that the photosensitive element always has visual contact with the mirror, i.e. no shutter (closure) or the like is provided. Furthermore, provision can also be made for the comparison via the comparator device to be carried out continuously. That is to say the acquired pattern is immediately compared with a reference signal in order to provide the comparison result. In particular, it is not the case that a multiplicity of instances of the light sampling are carried out and the comparison is only carried out thereafter. The photosensitive element can acquire the pattern portion with a frequency of e.g. 10 to 100 kHz or more.

Furthermore, a method for establishing a tilt angle of at least one mirror of a lithography installation is provided. It includes the following steps: generating a pattern, acquiring the pattern reflected on the mirror, comparing the acquired pattern with a reference pattern and providing a comparison result, and establishing the tilt angle in a manner dependent on the comparison result. The acquisition of the pattern and the comparison of the acquired pattern with the reference pattern occur in the same integrated circuit.

The features and developments explained in the present case for the apparatus according to the disclosure apply accordingly to the method according to the disclosure.

BRIEF DESCRIPTION OF THE DRAWINGS

Further exemplary embodiments are explained in more detail with reference being made to the attached figures in the drawings.

FIG. 4 shows general sinusoidal signals for the setup from FIG. 2;

DETAILED DESCRIPTION

Figure 1:
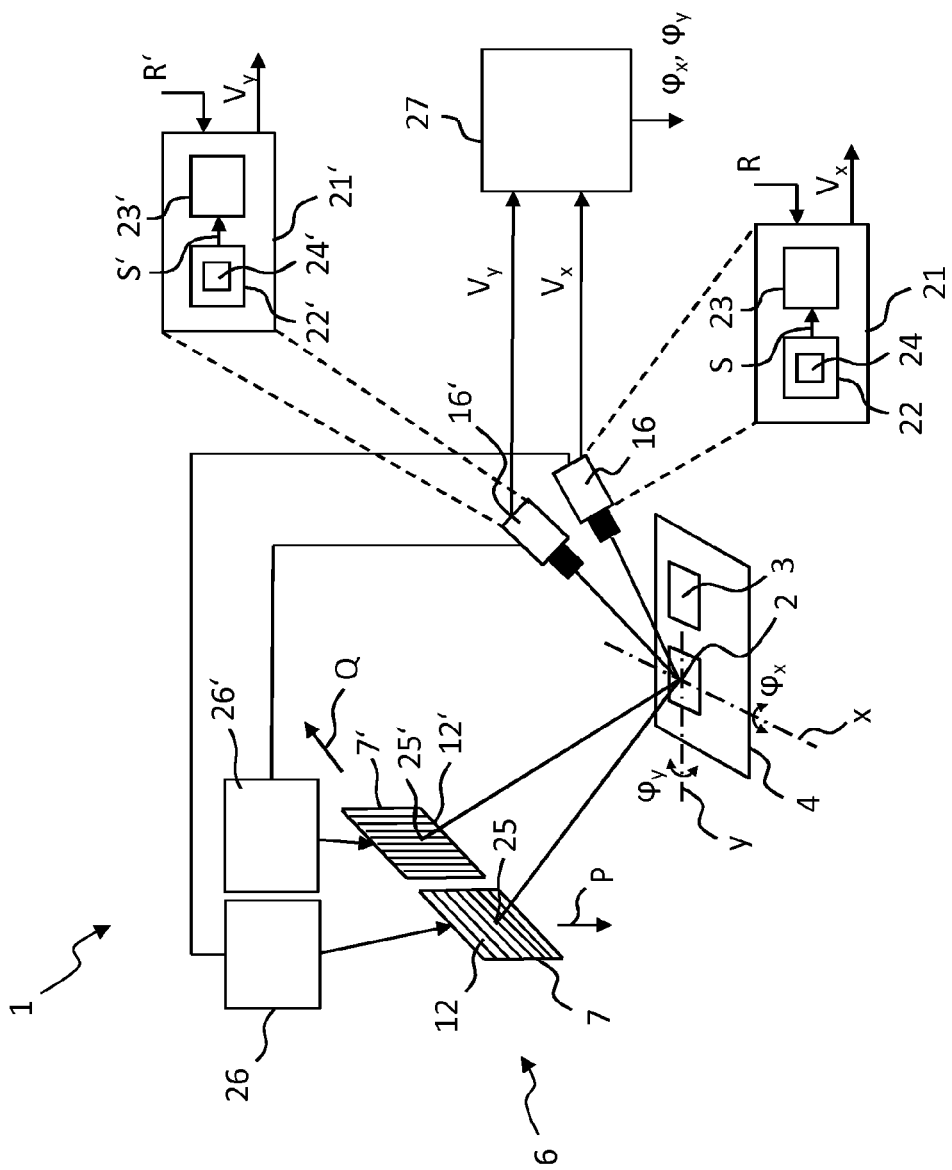
FIG. 1 shows a perspective view of an apparatus in accordance with an exemplary embodiment.

Unless otherwise indicated, the same reference numerals in the figures designate elements that are the same or functionally the same. So that a better distinction can be made, corresponding components are denoted by the ' symbol. It should also be noted that the representations in the figures are not necessarily to scale.

Figure 9:
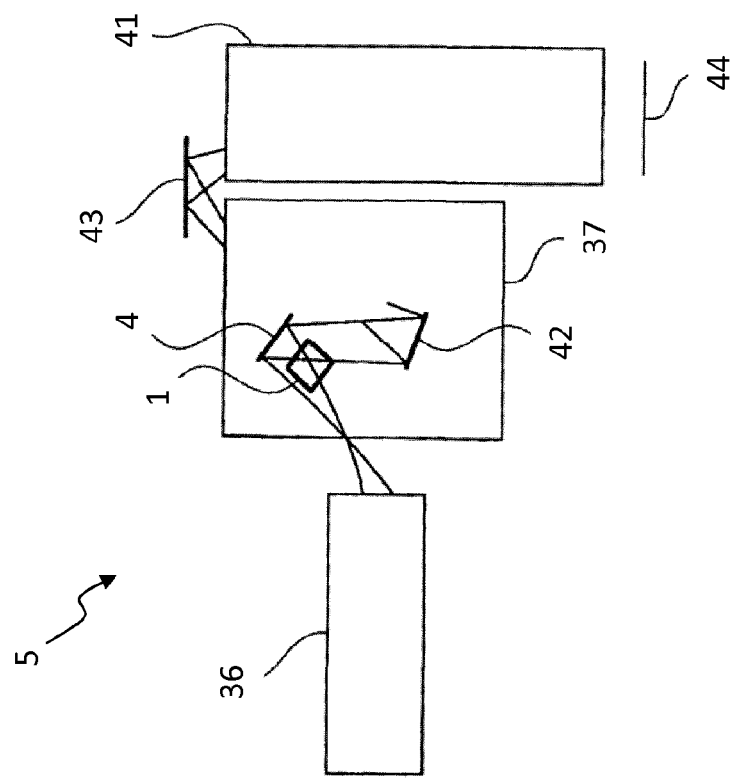
FIG. 9 shows an EUV lithography installation in accordance with one embodiment.

In a perspective view, FIG. 1 shows an apparatus 1 for establishing tilt angles $\varphi_x$, $\varphi_y$ of a plurality of mirrors 2, 3 of a mirror field 4 of a lithography installation 5 shown in FIG. 9. Suitable actuators (not depicted here) which are configured to tilt a respective mirror 2, 3 about the x, y axes can be assigned to a respective mirror 2, 3 for the purposes of adjusting the tilt angles $\varphi_x$, $\varphi_y$.

The apparatus 1 includes a pattern generating device 6 with two separate pattern sources 7, 7'. By way of example, the pattern sources 7, 7' are embodied as TFT screens or diode fields. On the pattern source 7, a pattern 12 runs across in the direction of the arrow P, i.e., for example, from top to bottom. By way of example, the pattern 12 can have bright/dark regions migrating vertically from top to bottom. The pattern source 7' shows a pattern 12' which runs across in the direction of the arrow Q, i.e., for example, horizontally from left to right. Here, the pattern 12' can likewise have alternating bright/dark regions, which move from left to right.

Furthermore, the apparatus 1 includes two cameras 16, 16'. By way of example, the cameras 16, 16' each include a multiplicity of (e.g. several hundred thousand) integrated circuits 21, 21', wherein only one is shown in each case in an exemplary manner and in a magnified view in FIG. 1.

The integrated circuit 21 assigned to the camera 16 includes an image acquisition device 22 and a comparator device 23.

The image acquisition device 22 includes a photosensitive element 24. The photosensitive element 24 acquires a pattern portion 25 of the pattern 12 continuously, i.e. no shutter or the like, which could interrupt the light path between the photosensitive element 24 and the mirror 2, is provided.

The comparator device 23 has a correlator, a phase loop or a phase-measuring circuit.

A respective mirror 2, 3—as explained in an exemplary manner below for the mirror 2—images a pattern portion 25 on the photosensitive element 24 of the integrated circuit 21. The photo-element 24 converts the incoming light signals into electrical measurement signals S. The measurement signal S (also referred to as acquired pattern in the present case) is compared with a reference signal R (also referred to as reference pattern in the present case) in the comparator device 23 of the integrated circuit 21. The tilt angle $\varphi_x$ is established from the phase difference, as will still be explained in more detail below on the basis of FIGS. 2 and 3A to 3D. In this case, the comparator device 23 obtains the reference signal R from an actuation device 26 which actuates the pattern source 7 for displaying the pattern 12.

The comparison result $V_x$ is transferred from the integrated circuit 21 or the camera 16 to an evaluation device 27. The evaluation device 27 establishes the tilt angle $\varphi_x$ of the mirror 2 about the x-axis (first axis) in a manner dependent on the comparison result $V_x$.

The camera 16' has the same setup as the camera 16. The explanations made above in respect to the circuit 21 apply accordingly to the circuit 21'.

The camera 16' or the circuit 21' is coupled to an actuation unit 26' which provides the reference signal R'. The actuation unit 26' is configured to actuate the pattern source 7' for displaying the pattern 12'. The circuit 21' records a pattern portion 25', which is mirrored thereon by the pattern source 7' by way of the mirror 2. The circuit 21' then provides the evaluation device 27 with a comparison result $V_y$. The evaluation device 27 establishes the tilt angle $\varphi_y$ about the y-axis (second axis) perpendicular to the x-axis in a manner dependent on the comparison result $V_y$.

In accordance with one embodiment (as is shown in an exemplary manner in FIGS. 5 and 6 for the pattern source 7), the patterns 12, 12' each only have one period over the height H (spatial direction P) of the pattern source 7 or the width (spatial direction Q) of the pattern source 7', promoting a unique and hence quick establishment of the tilt angle $\varphi_x$, $\varphi_y$.

The pattern sources 7, 7' can also be arranged opposite one another. Accordingly, the cameras 16, 16' are also arranged opposite one another in that case.

Below, the establishment of the tilt angle $\varphi_x$ of the mirror 2 is explained in an exemplary manner on the basis of FIGS. 2 and 3. These explanations apply accordingly to the tilt angle $\varphi_y$, and also to the other mirrors 3.

Figure 2:
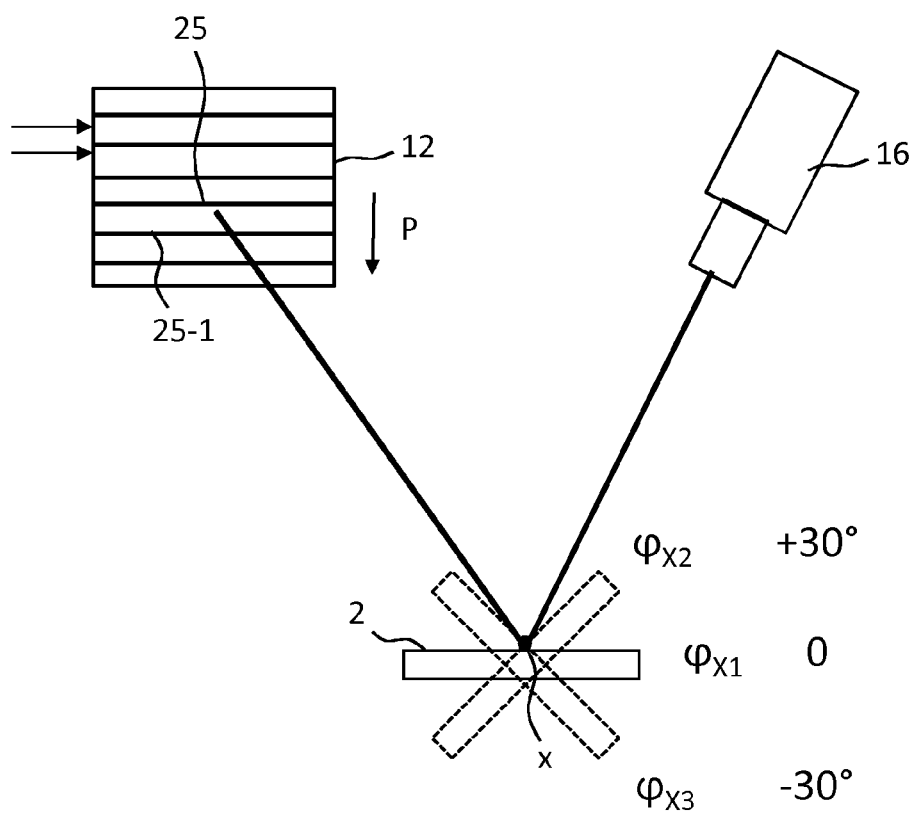
FIG. 2 shows a schematic view of a mirror from FIG. 1, along with a pattern generating device and camera.

In a side view, FIG. 2 schematically shows the mirror 2 in different positions about the x-axis, to be precise in the positions $\varphi_{x1}$, $\varphi_{x2}$ and $\varphi_{x3}$.

Figure 3A:
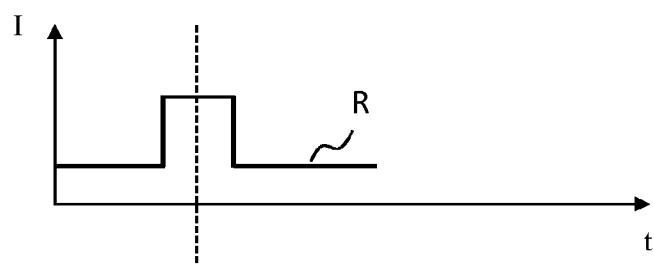
FIGS. 3A to 3D show various signals for the setup from FIG. 2.

FIG. 3A shows an e.g. rectangular reference signal R, which specifies a reference intensity I as a function of the time t.

Figure 3B:
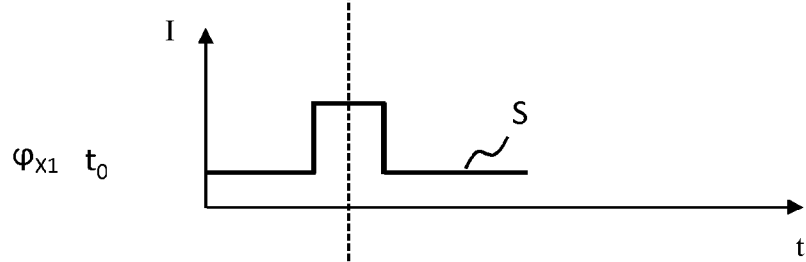

FIG. 3B shows the signal S for the angle $\varphi_{x1}$ at the time t0. It is possible to identify that there is no phase offset between the reference signal R and the signal S. Hence, the evaluation device 27 identifies that the mirror 2 is situated in the 0° position.

Figure 3C:
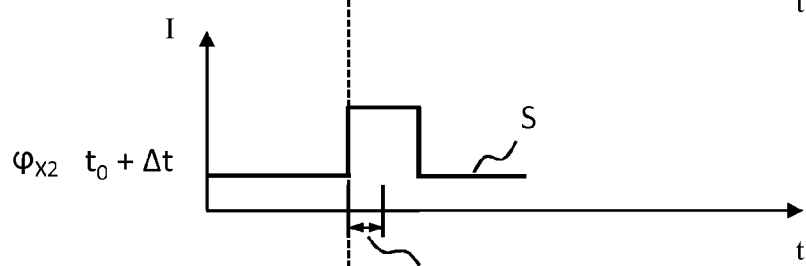
Figure 3D:
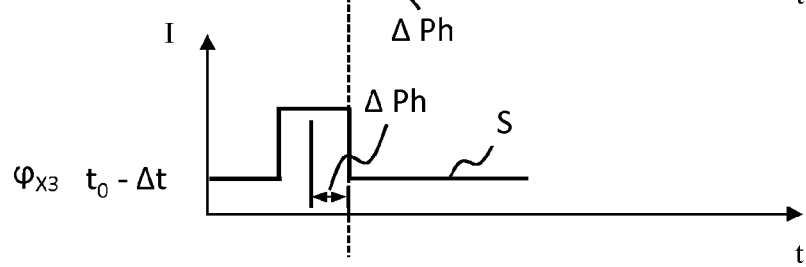

If—as is shown on the basis of FIGS. 2 and 3C—the mirror 2 now swivels e.g. into the position $\varphi_{x2}$, e.g. +30°, the mirror 2 transmits a different pattern portion 25-1 to the camera 16', and so the rectangular pulse is only recorded at the time $t_0+\Delta t$ by the camera 16'. The evaluation device 27 establishes the tilt angle $\varphi_{x2}$ from the corresponding phase offset $\Delta Ph$. Accordingly, the phase offset $\Delta Ph$ in FIG. 3D can also be assigned to a tilt angle $\varphi_{x3}$ of e.g. −30°.

FIG. 4 shows a measurement signal S which is provided to the comparator device 23 by the image acquisition device 22. Here, the measurement signal S describes the intensity I of the recorded light over time t.

Furthermore, FIG. 4 shows a reference signal R in accordance with a further embodiment. The signals S, R are sinusoidal in each case and have a phase difference $\Delta Ph$. On the basis of the phase difference $\Delta Ph$, the evaluation device 27 establishes the angle $\varphi_x$ in accordance with one embodiment.

Figure 5:
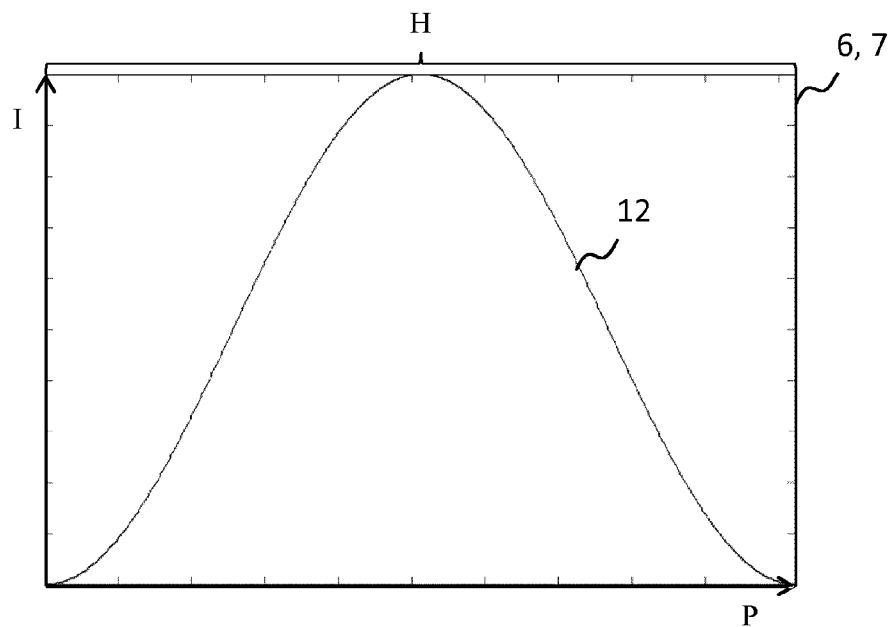
FIG. 5 shows a sinusoidal signal, the period of which equals the width of the pattern generating device.

FIG. 5 shows a pattern 12, the period of which corresponds to the extent of a pattern generating device 6 or pattern source 7 in one spatial direction P, i.e. for example the extent of the screen height H, and the pattern runs across in the spatial direction P. In this case, the evaluation device 27 can deduce the tilt angle $\varphi_x$ on the basis of a single phase comparison of the acquired pattern S with the reference pattern R.

Alternatively, the pattern 12 shown in FIG. 5 can also be constant in time, i.e. not running across. The tilt angle $\varphi_x$ can only be established by comparing the acquired intensity (or the wavelength in one embodiment, in which e.g. a grayscale value or a color channel is acquired) of the acquired pattern 12 or the corresponding measurement signal S with an intensity (or wavelength in the other embodiment) of the reference pattern R. In the embodiment in which a color channel is acquired, the comparator device 23 can have a device for color channel analysis.

Figure 6:
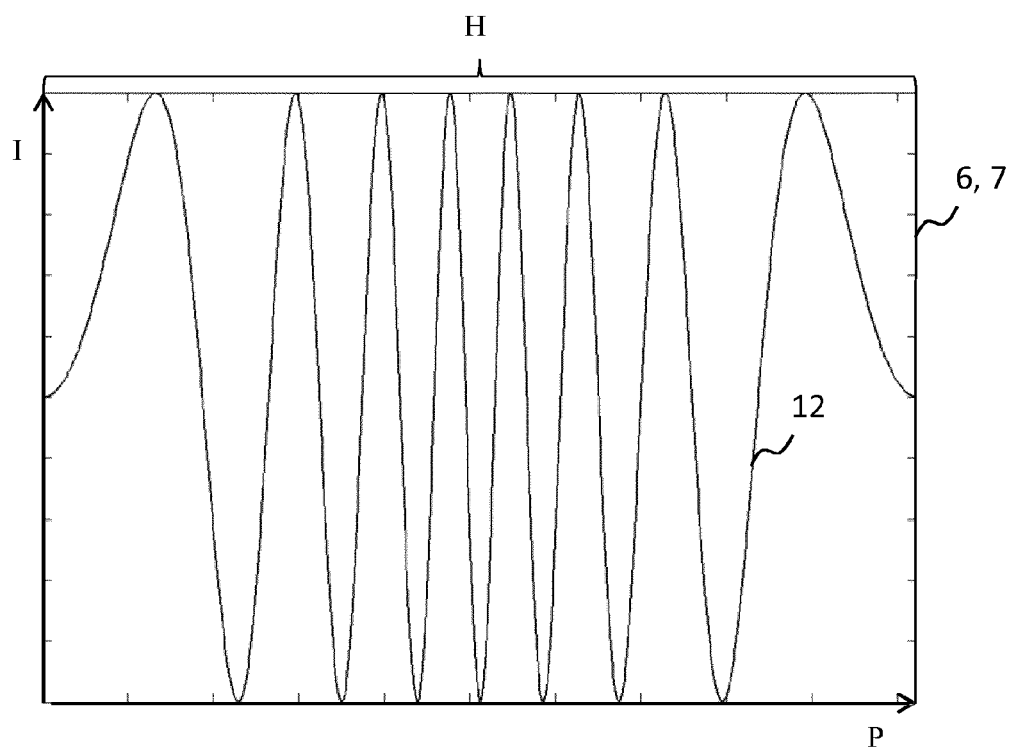
FIG. 6 shows a chirp signal, the period of which equals the width of the pattern generating device.

What is illustrated on the basis of FIG. 6 is that the pattern generating device 6 or pattern source 7 can be configured to generate a pattern 12 which has a chirp signal. The chirp signal includes a signal whose frequency changes over time. The chirp signal contains a fundamental frequency and frequencies which are an integer multiple of the fundamental frequency. The multiples of the fundamental frequency in view of time come about due to the temporal periodicity when the chirp signal is moved cyclically with constant speed over the pattern generating device. Furthermore, the chirp signal contains spatial frequencies which are not an integer multiple of the fundamental frequency.

The extent of the pattern generating device 6 or of pattern source 7 in one spatial direction P, i.e., for example, the screen height H, can correspond to a period of the chirp signal. The chirp signal can run across in the spatial direction P. In this case, the evaluation device 27 can deduce the tilt angle $\varphi_x$ on the basis of a single phase comparison of the acquired pattern S with the reference pattern R.

The tilt angle $\varphi_y$ can be established in the same way as $\varphi_x$.

Furthermore, it is possible for the pattern generating device 6 to generate an encoded pattern 12, which is decoded by the evaluation or comparator device 23, 27 in order to determine the tilt angle $\varphi_x$.

Figure 7:
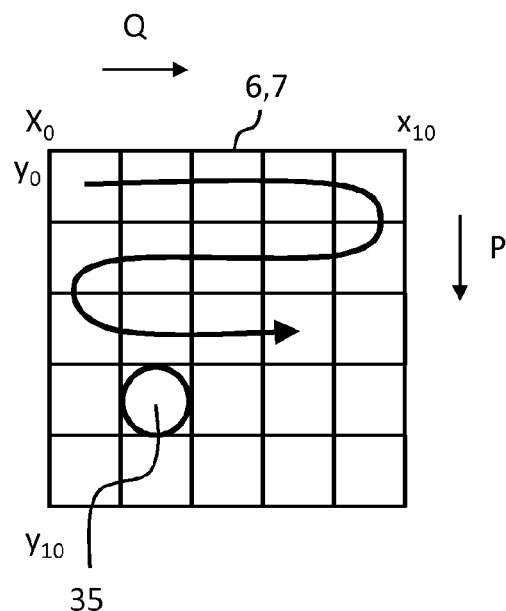
FIG. 7 shows a pattern generating device in accordance with one embodiment.

FIG. 7 shows a pattern generating device 6 in accordance with a further embodiment. Here, a light spot 35 moves in the directions P, Q shown in FIG. 1, for example along a meandering line. The evaluation device 27 is configured to establish how the mirror 2 is tilted about the x- and y-axes by a temporal signal analysis. The tilt of the mirror 2 about the x- and y-axes determines the position x0 to x10 and y0 to y10 from which light from the pattern source 7 is guided onto the photosensitive element 24 by way of the mirror 2.

If the light spot 35 runs through the meandering trajectory thereof in a periodic manner, this results periodically in respect of the time axis in an intensity maximum of the signal acquired by the photosensitive element 24. The maximum occurs precisely when the light spot 35 is situated at the position x0 to x10, y0 to y10 from which light is also guided to the photosensitive element 24 due to the tilt of the mirror. By way of these relationships, tilting the mirror 2 about the x- and y-axes leads to a temporal shift of the intensity maximum in the signal of the photosensitive element 24 in respect of time. Determining the position in time or phase angle of the intensity maximum therefore renders it possible to determine the tilt of the mirror 2 about the x- and y-axes. In this case, the pattern generating device 6 only has one pattern source 7 (for example a single screen), which is sufficient to establish the tilt of the mirror 2 about both axes x, y.

Figure 8:
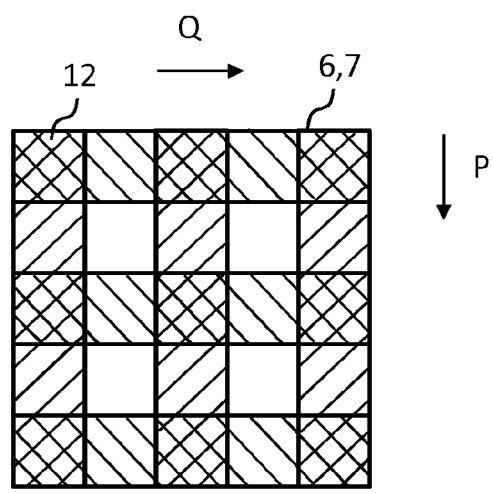
FIG. 8 shows a pattern generating device in accordance with a further embodiment.

FIG. 8 shows an embodiment with a pattern generating device 6 which likewise only has a single pattern source 7. The pattern source 7 is configured to display two patterns 12, 12' which are superimposed on one another and which vary in time in two directions P, Q. The patterns 12, 12' have frequencies which do not influence one another or allow the establishment of the angles $\varphi_x$, $\varphi_y$.

Alternatively, the pattern source 7 can be configured to display two patterns 12, 12' in alternation.

In the case of the exemplary embodiment according to FIG. 8, provision can be made of two cameras 16, 16'. Alternatively, provision can be made of only one camera 16, wherein the circuit 21 evaluates the patterns 12, 12' or the portions of the pattern reflected by way of the mirror 2 in a multiplexing method.

FIG. 9 schematically shows an EUV lithography installation 5.

The EUV lithography installation 5 includes a light-forming unit 36, an illumination system 37 and a projection lens 41. The light (working light) from the light-forming unit 36, which is partly depicted in FIG. 9 in a schematic manner as a beam path, is guided, e.g. in the illumination system 37, onto mirrors 2, 3 (see FIG. 1) of a mirror field 4, which reflect the light onto mirrors of a mirror field 42. A reticle 43 is illuminated at the end of the illumination system 37. Thereupon, the light is directed onto a substrate 44 in the projection lens 41 such that the structure contained in the reticle 43 is imaged with a reduced size on the substrate 44.

The tilt angles $\varphi_x$, $\varphi_y$ of the mirrors 2, 3 of the mirror field 4 are monitored via the apparatus 1 from FIG. 1, which is only depicted schematically in FIG. 9. Here, the patterns 12, 12' are imaged on the mirrors 2, 3 along a beam path at an angle of e.g. 90° with respect to the beam path of the working light in the illumination system 37. Hence, monitoring the tilt angles $\varphi_x$, $\varphi_y$ of the mirrors 2, 3 does not interfere with the imaging of the desired structure onto the substrate 44. A tilt angle regulation of the mirrors 2, 3 can be carried out digitally.

Although the disclosure has been described on the basis of various exemplary embodiments, it is not in any way restricted to them but may be modified in a wide variety of ways.

LIST OF REFERENCE SIGNS

1 Apparatus
2 Mirror
3 Mirror
4 Mirror field
5 Lithography installation
6 Pattern generating device
7 Pattern source
7' Pattern source
12 Pattern
12' Pattern
16 Camera
16' Camera
21 Circuit
21' Circuit
22 Image acquisition device
22' Image acquisition device
23 Comparator device
23' Comparator device
24 Photosensitive element
24' Photosensitive element
25 Pattern portion
25' Pattern portion
25-1 Pattern portion
26 Actuation unit
26' Actuation unit
27 Evaluation device
35 Light spot
36 Light-forming unit
37 Illumination system
41 Projection lens
42 Mirror field
43 Reticle
44 Substrate
I Intensity
H Screen height
P Direction
Q Direction
R Reference signal
R' Reference signal
S Measurement signal
S' Measurement signal
t Time
$V_x$ Comparison result
$V_y$ Comparison result
x Axis
y Axis
ΔPh Phase offset
$\varphi_x$ Tilt angle
$\varphi_y$ Tilt angle

The invention claimed is:

1. An apparatus configured to establish a tilt angle of a mirror of a lithography installation, the installation comprising:
    a first device configured to generate a pattern;
    an integrated circuit, comprising:
        a second device configured to acquire the generated pattern after the generated pattern is reflected by the mirror; and
        a third device which comprises at least one member selected from the group consisting of a correlator and a phase loop, the third device being configured to provide a comparison result in a manner dependent on a comparison of a phase of the acquired pattern with a phase of a reference pattern; and
        a fourth device configured to establish the tilt angle depending on the comparison result.

2. The apparatus of claim 1, wherein the first device is configured to generate a time-varying pattern.

3. The apparatus of claim 1, wherein the first device is configured to generate first and second patterns, the first generated pattern is time varying in a first direction, and the second generated patterns is time varying in a second direction which is perpendicular to the first direction.

4. The apparatus of claim 3, wherein the first device comprises first and second sources, the first source is configured to generate the first generated pattern, and the second source is configured to generate the second generated pattern.

5. The apparatus of claim 3, wherein the second device is configured to alternately acquire the first and second generated patterns, and the third device is configured to alternate between comparing the first acquired pattern to a first reference pattern and comparing the second acquired pattern to a second reference pattern.

6. The apparatus of claim 1, wherein the first device is configured to generate a pattern which is time varying in mutually perpendicular directions.

7. The apparatus of claim 6, wherein the first device comprises a single source configured to generate the pattern.

8. The apparatus of claim 1, wherein the pattern has exactly one period.

9. The apparatus of claim 1, wherein the first device is configured to generate a chirp signal.

10. The apparatus of claim 1, wherein the pattern is constant in time.

11. The apparatus of claim 1, wherein the second device comprises a photosensitive element configured to acquire the pattern continuously.

12. A projection lens, comprising:
the apparatus of claim 1,
wherein the projection lens is an EUV lithography projection lens.

13. A lithography installation, comprising:
an illumination system; and
a projection lens comprising the apparatus of claim 1,
wherein the lithography installation is an EUV lithography installation.

14. The apparatus of claim 1, wherein the third device comprises a correlator.

15. The apparatus of claim 1, wherein the third device comprises a phase loop.

16. An apparatus configured to establish a tilt angle of a mirror of a lithography installation, the installation comprising:
a first device configured to generate first and second patterns, the first pattern being time varying in a first direction, and the second pattern being time varying in a second direction which is perpendicular to the first direction;
a first integrated circuit, comprising:
a second device configured to acquire the first pattern after the first pattern is reflected by the mirror; and
a third device which comprises at least one member selected from the group consisting of a correlator and a phase loop, the third device being configured to provide a comparison result in a manner dependent on a comparison of a phase of the first acquired pattern with a phase of a first reference pattern;
a second integrated circuit, comprising:
a fourth device configured to acquire the second pattern after the second pattern is reflected by the mirror; and
a fifth device configured to provide a comparison result in a manner dependent on a comparison of the second acquired pattern with a second reference pattern; and
a sixth device configured to establish the tilt angle depending on the first and second comparison results.

17. The apparatus of claim 16, further comprising first and second cameras, wherein the first camera comprises the first integrated circuit, and the second camera comprises the second integrated circuit.

18. A projection lens, comprising:
the apparatus of claim 16,
wherein the projection lens is an EUV lithography projection lens.

19. A lithography installation, comprising:
an illumination system; and
a projection lens comprising the apparatus of claim 16,
wherein the lithography installation is an EUV lithography installation.

20. A method of establishing a tilt angle of a mirror of a lithography installation, the method comprising:
generating a pattern;
acquiring the pattern after it is reflected by the mirror;
using a device of an integrated circuit to compare a phase of the acquired pattern with a phase of a reference pattern and providing a comparison result; and
establishing the tilt angle in a manner dependent on the comparison result,
wherein acquiring the pattern and comparing the acquired pattern with the reference pattern occur in the circuit, and the device comprises at least one member selected from the group consisting of a correlator and a phase loop.

* * * * *

UNITED STATES PATENT AND TRADEMARK OFFICE
CERTIFICATE OF CORRECTION

PATENT NO. : 10,007,195 B2
APPLICATION NO. : 15/145114
DATED : June 26, 2018
INVENTOR(S) : Jan Horn, Markus Holz and Joerg Specht It is certified that error appears in the above-identified patent and that said Letters Patent is hereby corrected as shown below:

On the Title Page

Column 1 Item (*) (Notice), Line 3: After "0 days." delete "days.".

In the Specification

Column 5, Line 36: Delete "intergrated" and insert -- integrated --, therefor.

Column 8, Line 45: Delete "angle $\varphi_x$." and insert -- angle $\varphi_x$, $\varphi_y$. --, therefor.

Signed and Sealed this
Second Day of October, 2018

Andrei Iancu
*Director of the United States Patent and Trademark Office*